(12) United States Patent
Yamazawa

(10) Patent No.: US 12,347,640 B2
(45) Date of Patent: Jul. 1, 2025

(54) ELECTRON BEAM APPARATUS

(71) Applicant: Hitachi High-Tech Corporation, Tokyo (JP)

(72) Inventor: Yu Yamazawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 1245 days.

(21) Appl. No.: 15/734,845

(22) PCT Filed: Jun. 4, 2018

(86) PCT No.: PCT/JP2018/021335
§ 371 (c)(1),
(2) Date: Dec. 3, 2020

(87) PCT Pub. No.: WO2019/234787
PCT Pub. Date: Dec. 12, 2019

(65) Prior Publication Data
US 2021/0233737 A1    Jul. 29, 2021

(51) Int. Cl.
*H01J 37/147*    (2006.01)
*H01J 37/141*    (2006.01)
(Continued)

(52) U.S. Cl.
CPC ........ *H01J 37/1475* (2013.01); *H01J 37/141* (2013.01); *H01J 37/153* (2013.01); *H01J 37/28* (2013.01)

(58) Field of Classification Search
CPC .... H01J 37/1475; H01J 37/141; H01J 37/153; H01J 37/28; H01J 2237/1506; H01J 2237/1534; H01J 2237/2803
See application file for complete search history.

(56) References Cited

U.S. PATENT DOCUMENTS

| 2011/0108736 A1 | 5/2011 | Preikszas |
| 2015/0001393 A1 | 1/2015 | Kotake et al. |
| 2020/0035449 A1* | 1/2020 | Nakano ................. H01J 37/141 |

FOREIGN PATENT DOCUMENTS

| CN | 104040676 A | 9/2014 |
| DE | 10 2009 052 392 A1 | 12/2011 |

(Continued)

OTHER PUBLICATIONS

German-language Office Action issued in German Application No. 11 2018 007 564.8 dated Aug. 9, 2023 with English translation (11 pages).

(Continued)

*Primary Examiner* — Elmito Breval
(74) *Attorney, Agent, or Firm* — Crowell & Moring LLP

(57) ABSTRACT

In an electron beam apparatus performing angular scanning that changes an incident angle of an electron beam incident at a predetermined incident position on a sample, when a correction coil is provided in a gap portion of a yoke (magnetic path) of an objective lens, spherical aberration can be corrected by following a deflection signal even if a deflection frequency increases. Therefore, a main control unit that controls an electron optical system sets predetermined phase change amounts a, b with respect to control of a scanning coil in control of the correction coil, and the predetermined phase change amounts a, b are made different depending on a plurality of scanning modes having different scanning speeds.

13 Claims, 5 Drawing Sheets

(51) Int. Cl.
*H01J 37/153* (2006.01)
*H01J 37/28* (2006.01)

(56) References Cited

FOREIGN PATENT DOCUMENTS

| | | | |
|---|---|---|---|
| JP | 56-52859 | A | 5/1981 |
| JP | 61-4145 | A | 1/1986 |
| JP | 62-61253 | A | 3/1987 |
| JP | 62-184750 | A | 8/1987 |
| JP | 64-30154 | A | 2/1989 |
| JP | 4-32143 | A | 2/1992 |

OTHER PUBLICATIONS

International Search Report (PCT/ISA/210) issued in PCT Application No. PCT/JP2018/021335 dated Aug. 28, 2018 with English translation (five (5) pages).
Japanese-language Written Opinion (PCT/ISA/237) issued in PCT Application No. PCT/JP2018/021335 dated Aug. 28, 2018 (three (3) pages).
Chinese-language Office Action issued in Chinese Application No. 201880094321.9 dated Oct. 28, 2023 with English translation (14 pages).

* cited by examiner

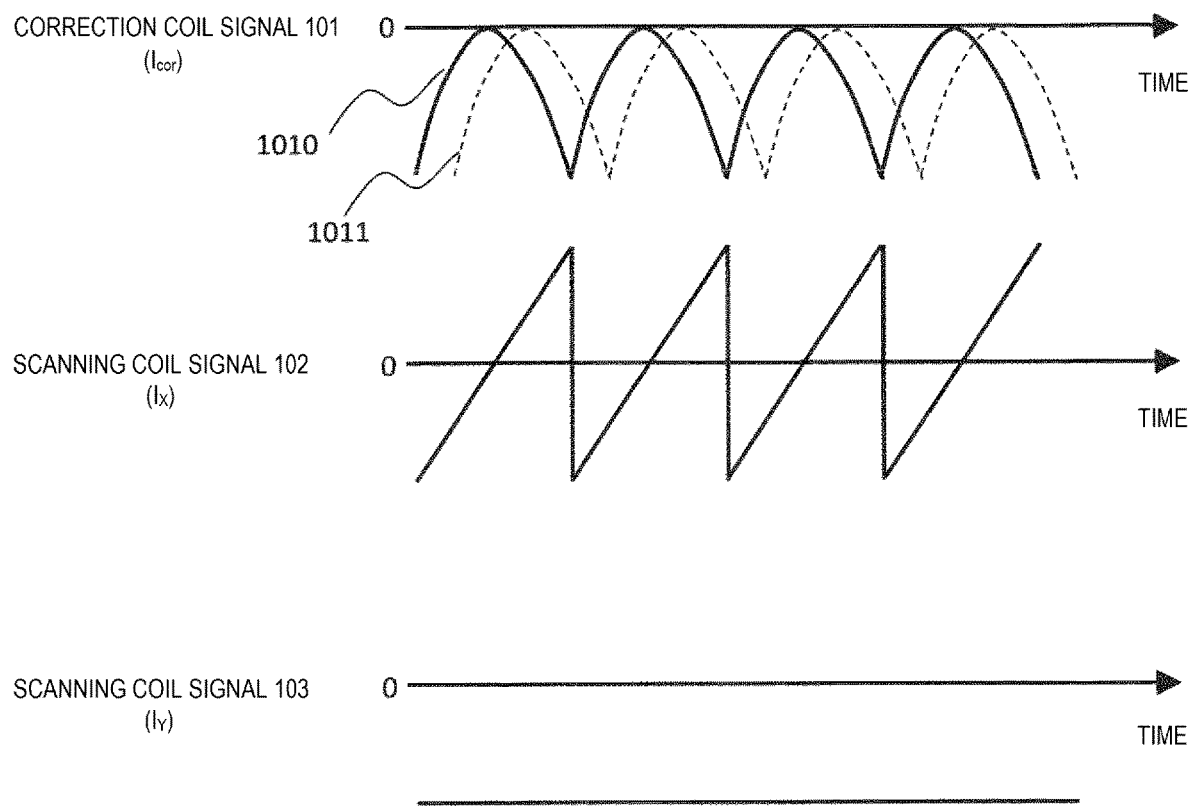
[FIG. 1]

[FIG. 2A]
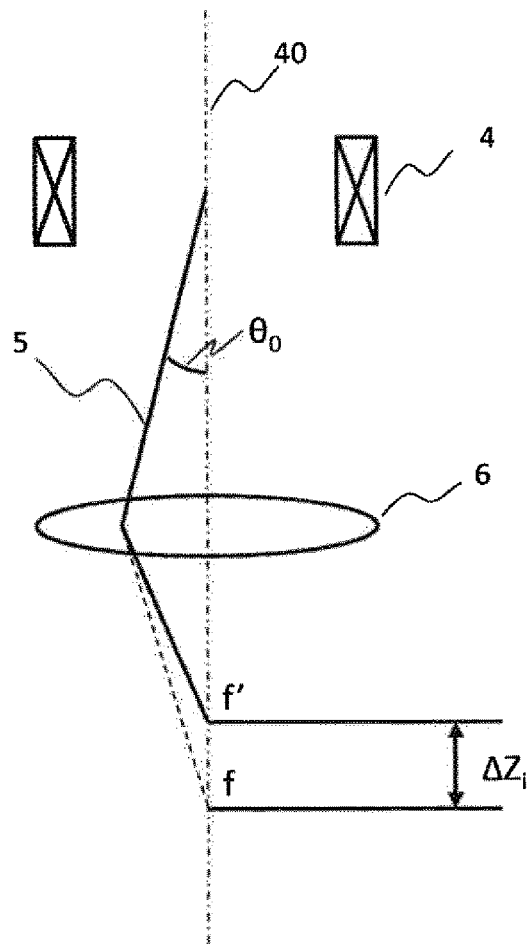
[FIG. 2B]
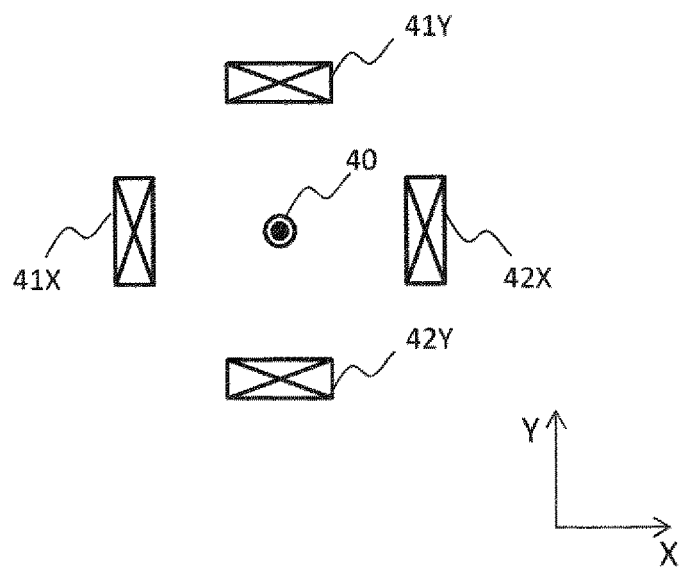

[FIG. 3]
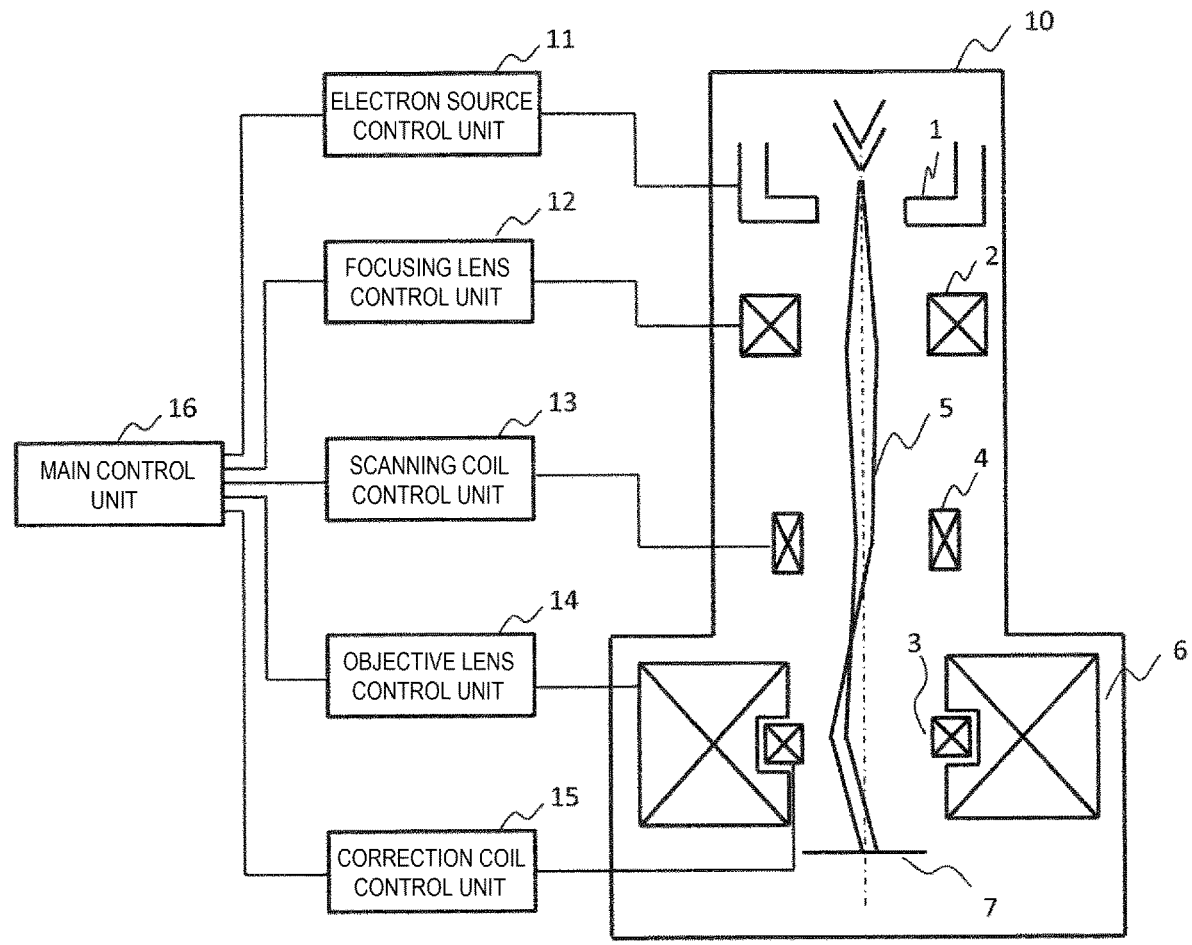
[FIG. 4]
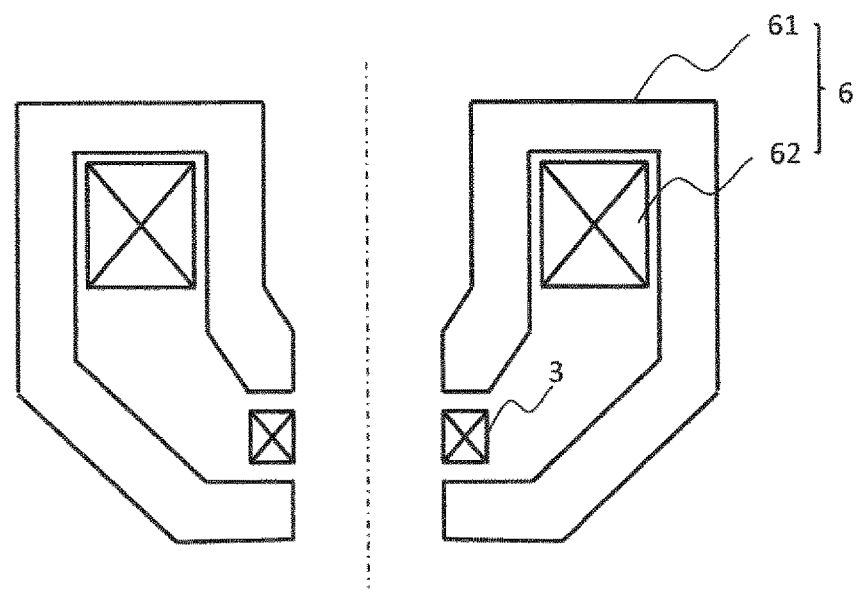

[FIG. 5]
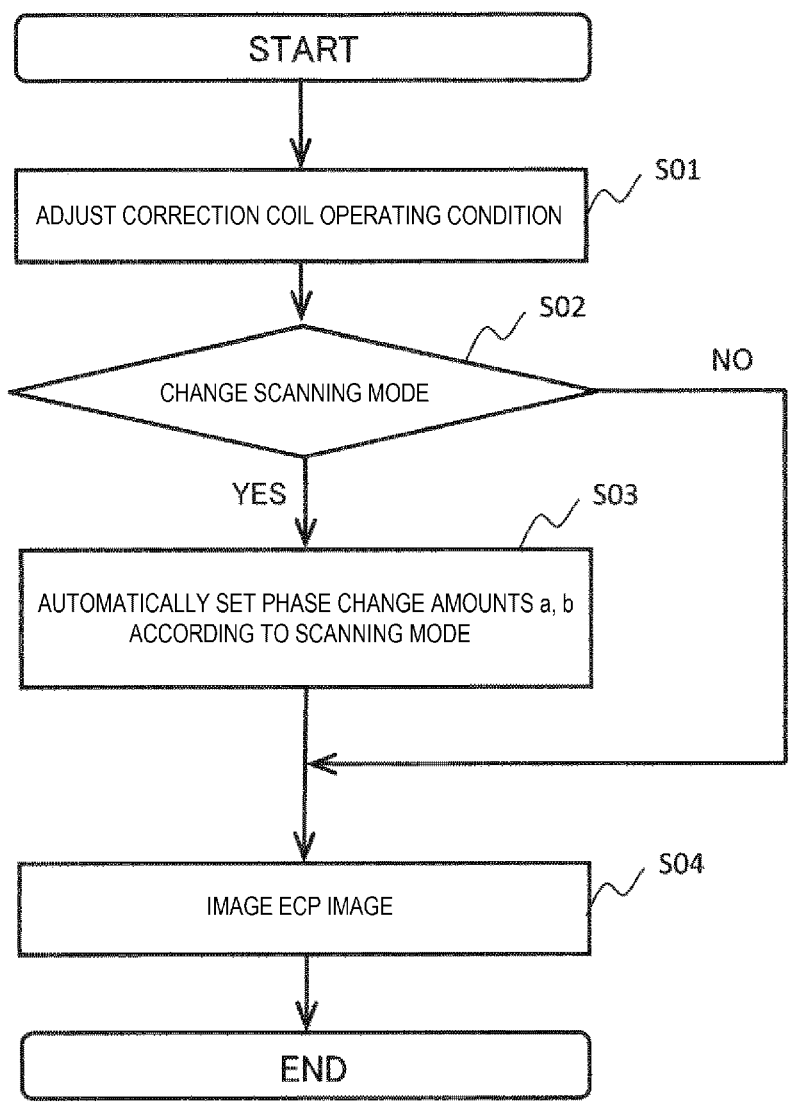

| SCANNING MODE | $\alpha$ | $\beta$ |
|---|---|---|
| SCANNING MODE 1 | $\alpha_1$ | $\beta_1$ |
| SCANNING MODE 2 | $\alpha_2$ | $\beta_2$ |
| ... | | |
| SCANNING MODE i | $\alpha_i$ | $\beta_i$ |
| ... | | |
| SCANNING MODE N (REFERENCE SCANNING MODE) | 0 | 0 |

ELECTRON BEAM APPARATUS

TECHNICAL FIELD

The present invention relates to an electron beam apparatus such as a scanning electron microscope and a transmission electron microscope, and particularly to an electron beam apparatus suitable for observation of an electron channeling pattern.

BACKGROUND ART

As an application of a scanning electron microscope (SEM) or a transmission electron microscope (TEM), there is a selected area electron channeling pattern (SACP) method that can obtain a microscopic crystal structure of an observation portion. In the SACP method, an electron channeling pattern (ECP) image can be obtained by fixing an electron beam at one point on a sample and performing angular scanning that changes an incident angle of the electron beam. A crystal structure and crystal strain of the sample can be analyzed from crystal orientation distribution in the sample appearing in the ECP image.

When the angular scanning is performed to obtain the ECP image, the electron beam is deflected by a deflector, and the electron beam deflected to the outside of an optical axis is swung back by an objective lens to change the incident angle of the electron beam onto the sample. When the electron beam deviates significantly out of the axis and passes through the objective lens, the electron beam is not fixed at one point due to spherical aberration of the objective lens, an irradiation area expands, and a clear ECP image cannot be obtained. For this reason, an electron optical system that observes the ECP image by applying the SACP method is provided with a corrector that corrects the spherical aberration.

Examples of citation list include PTLs 1 and 2 which disclose an electron beam apparatus for obtaining an ECP image. PTL 1 aligns an axis of a dynamic focus lens which corrects the spherical aberration with an axis of an objective lens in order to correct spherical aberration with high accuracy, and discloses that a phase of a correction current supplied to the dynamic focus lens is controlled for this axis alignment. Further, PTL 2 discloses that even when a deflection frequency increases, in order to follow a deflection signal to correct spherical aberration, a lens unit is provided between a deflector and an objective lens and a focal length thereof is adjusted, or an electrostatic lens is provided in the objective lens and a lens action of the electrostatic lens is adjusted to correct the spherical aberration.

CITATION LIST

Patent Literature

PTL 1: JP-A-S61-4145
PTL 2: JP-A-H04-32143

SUMMARY OF INVENTION

Technical Problem

As a related art of PTL 2, a configuration is disclosed in which a spherical aberration correction coil which corrects spherical aberration is provided in a gap portion of a yoke (magnetic pole) of an objective lens. In this configuration, due to an influence of a magnetic path generated by an objective lens coil, the spherical aberration correction coil apparently acts as a cored coil, and inductance thereof increases. Therefore, there is a problem that when a deflection frequency increases, a current waveform of the spherical aberration correction coil cannot follow a deflection signal due to the inductance of the spherical aberration correction coil, it is difficult to reliably respond to lens intensity, and fast angular scanning cannot be performed.

The invention provides, in a configuration in which a spherical aberration correction coil is provided in a gap portion of a yoke (magnetic path) of an objective lens, an electron beam apparatus capable of following a deflection signal to correct spherical aberration and obtaining a clear ECP image even when a deflection frequency increases.

Solution to Problem

According to an embodiment of the invention, there is provided an electron beam apparatus performing angular scanning that changes an incident angle of an electron beam incident at a predetermined incident position on a sample, and having a plurality of scanning modes having different scanning speeds of the angular scanning, the electron beam apparatus including: a scanning coil that deflects the electron beam, an objective lens that swings back the electron beam deflected to the outside of an optical axis by the scanning coil, a correction coil disposed in a gap portion of a magnetic pole of the objective lens, and a main control unit that controls an electron optical system including the scanning coil, the objective lens, and the correction coil. The main control unit sets predetermined phase change amounts with respect to control of the scanning coil in control of the correction coil, and the predetermined phase change amounts differ depending on the plurality of scanning modes.

Advantageous Effect

By setting a phase change amount suitable for a scanning mode, accurate spherical aberration correction can be performed even at different scanning speeds.

Other problems and novel features will be apparent from a description of the description and accompanying drawings.

BRIEF DESCRIPTION OF DRAWINGS

FIG. 1 is a diagram illustrating synchronization control of scanning coils and a correction coil and response delay of the correction coil.

FIG. 2A is a diagram for illustrating control by the correction coil.

FIG. 2B is a schematic configuration diagram of the scanning coils.

FIG. 3 is a schematic configuration diagram of an electron optical system.

FIG. 4 is a cross-sectional view of an objective lens and the correction coil.

FIG. 5 is a diagram illustrates an imaging flow of an ECP image.

FIG. 6 is a diagram illustrating a correction table.

DESCRIPTION OF EMBODIMENTS

FIG. 3 illustrates a schematic configuration diagram of an electron optical system in an electron beam apparatus that obtains an ECP image. An electron beam 5 emitted from an electron source 1 is focused by a focusing lens 2 and deflected by a scanning coil 4. An objective lens 6 swings back the electron beam 5 deflected to the outside of an optical axis by the scanning coil 4 to form a magnetic field for performing angular scanning on a surface of a sample 7. As described above, when a deflection angle deviates significantly out of the axis from several degrees to tens of degrees, an irradiation position of the electron beam 5 is not fixed at one point due to spherical aberration of the objective lens 6, an irradiation area expands, and a clear ECP image cannot be obtained. Therefore, a correction coil 3 which corrects the spherical aberration of the objective lens 6 is provided, and the spherical aberration of the objective lens 6 is corrected by exciting the correction coil 3 by an excitation amount corresponding to the deflection angle.

FIG. 4 shows a cross-sectional view of the objective lens 6 and the correction coil 3. The objective lens 6 includes a coil 62 which excites a magnetic field forming a magnetic field lens and a magnetic pole 61, and the correction coil 3 is disposed in a gap portion of the magnetic pole 61.

The electronic optical system is stored in a lens body 10, optical elements constituting the electron optical system are controlled by control units 11 to 15 that control the optical elements respectively, and a main control unit 16 controls the control units 11 to 15. The main control unit 16 controls each of the control units 11 to 15 to irradiate the sample 7 with the electron beam 5 under a desired optical condition, and detects a signal electron emitted from the sample 7 by a detector (not shown) to obtain an ECP image.

Control of the correction coil 3 performed by the main control unit 16 will be described. In FIG. 2A, the electron beam 5 deflected by the scanning coil 4 is swung back by the objective lens 6 and ideally angularly scans around one point f on a sample surface. The electron beam 5 is deflected by the scanning coil 4 on an XY plane perpendicular to an optical axis 40. Therefore, as shown in FIG. 2B, the scanning coil 4 includes scanning coils 41X, 42X that deflect the electron beam 5 in an X direction, and scanning coils 41Y, 42Y that deflect the electron beam 5 in a Y direction. A deflection amount of the electron beam 5 depends on a current amount flowing through the scanning coil. More specifically, a deflection amount of the electron beam 5 in the X direction depends on a current amount $I_X$ of an X component flowing in scanning coils 41X, 42X, and a deflection amount of the electron beam 5 in the Y direction depends on a current amount $I_Y$ of a Y component flowing in scanning coils 41Y, 42Y.

Here, as shown in FIG. 2A, the electron beam 5 ideally angularly scans around one point f on the sample surface, but actually deviates to f' depending on a deflection angle $\theta_0$ due to the spherical aberration. If a deviation amount $\Delta Z_i$ represents a distance between f and f' on the optical axis, the deviation amount $\Delta Z_i$ is expressed by Equation 1.

$$\Delta Z_i = A \cdot C_s \cdot \theta_0^2 \quad \text{(Equation 1)}$$

Here, $C_s$ is spherical aberration coefficient of the objective lens 6, and A is a proportionality constant.

In addition, when a current $I_{cor}$ is passed through the correction coil 3 disposed in the gap portion of the magnetic pole of the objective lens 6, a focus change amount $\Delta Z_c$ generated in the objective lens 6 is expressed by Equation 2.

$$\Delta Z_c = B \cdot I_{cor} \quad \text{(Equation 2)}$$

Here, B is a proportionality constant.

Therefore, if $\Delta Z_c$ is controlled such that the sum of $\Delta Z_c$ and $\Delta Z_i$ becomes zero, the spherical aberration of the objective lens 6 is corrected. In an ideal system, the correction current $I_{cor}$ flowing in the correction coil 3 to correct the spherical aberration is represented by (Equation 3), in which $I_X$ represents the current amount of the X component flowing in the scanning coil 4, and $I_Y$ represents the current amount of the Y component.

$$I_{cor} = C \cdot C_s (I_X^2 + I_Y^2) \quad \text{(Equation 3)}$$

Here, C is a proportionality constant.

The scanning coil 4 and the correction coil 3 are synchronously controlled. FIG. 1 shows waveforms of a correction coil signal ($I_{cor}$) 101 and scanning coil signals ($I_x$, $I_y$) 102, 103. A period of the scanning coil signal $I_Y$ in the Y direction depends on the number of pixels of the acquired ECP image, but is about $10^2$ to $10^3$ times greater than a period of the scanning coil signal $I_X$ in the X direction. Therefore, in a range shown in FIG. 1, the scanning coil signal $I_Y$ in the Y direction is represented as substantially constant. Therefore, when the correction current $I_{cor}$ is controlled according to Equation 3, a correction coil signal 1010 (solid line) at an entrance of the correction coil 3 is substantially controlled in synchronization with the scanning coil signal (IX) 102. As described above, when the correction coil 3 is provided in the gap portion of the magnetic pole of the objective lens 6, inductance of the correction coil 3 increases, and when the deflection frequency increases, the correction current $I_{cor}$ cannot follow the scanning coil signal 102. That is, a delay occurs in a correction coil signal 1011 (dotted line) at an exit of the correction coil 3 with respect to the correction coil signal 1010 at the entrance of the correction coil 3. Due to the response delay of the correction current $I_{cor}$ of the correction coil 3, the spherical aberration of the objective lens 6 cannot be accurately corrected by Equation 3. Therefore, in order to correct the response delay of $I_{cor}$, a current value $I_{cor}$ of the correction coil 3 is controlled by a function shown in Equation 4.

$$I_{cor} = C \cdot C_s \cdot \{(I_x - a)^2 + (I_Y - b)^2\} \quad \text{(Equation 4)}$$

Here, a, b are phase change amounts. That is, by setting the phase change amounts a, b according to a scanning speed and a frequency or a cycle of the scanning coil signal 102 in the example of FIG. 1, it is possible to perform more accurate spherical aberration correction.

Further, PTL 1 shows that when an axis of the objective lens 6 deviates from an axis of the correction coil 3, a correction can be performed by a function of the same format as Equation 4. Normally, an electron beam apparatus has a plurality of scanning modes having different scanning speeds. Therefore, taking one of the scanning modes as a reference scanning mode, phase change amounts a', b' that align the axis of the objective lens 6 with the axis of the correction coil 3 are obtained, and the phase change amounts are corrected according to the scanning mode. At this time, the function of the current value $I_{cor}$ of the correction coil 3 is expressed by Equation 5.

$$I_{cor} = C \cdot C_s \cdot [\{I_X - (a' + \alpha_i)\}^2 + \{I_Y - (b' + \beta_i)\}^2] \quad \text{(Equation 5)}$$

Here, $\alpha_i$, $\beta_i$ are phase correction amounts from the reference scanning mode in a scanning mode i. $(a' + \alpha_i)$ and $(b' + \beta_i)$ respectively correspond to the phase change amounts a, b in Equation 4 in each scanning mode.

FIG. 5 shows an ECP image imaging flow based on the function (Equation 5). First, an optical condition of the electron beam apparatus is set, and a correction coil operating condition is adjusted (S01). The adjustment of the correction coil operation condition in step S01 is performed in the predetermined reference scanning mode, and the phase change amounts a', b' are obtained. When the scanning mode is not changed (NO in S02), the ECP image is imaged as it is (S04), and when the scanning mode is changed (YES in S02), the phase change amounts a, b are set according to the scanning mode (S03). The main control unit 16 stores a correction table as shown in FIG. 6, and automatically calculates the phase change amounts a, b according to the selected scanning mode. The correction table 601 holds the phase correction amounts $\alpha_i$, $\beta_i$ according to the scanning mode. In this example, the electron beam apparatus has N scanning modes, and the larger i is, the faster the scanning speed of the angular scanning is. The reference scanning mode is set to a scanning mode N, and the phase correction amounts $\alpha_i$, $\beta_i$ from the phase change amounts in the reference scanning mode are held according to the scanning mode. By setting the reference scanning mode as the scanning mode N in which the scanning speed is higher, adjustment time in step S01 can be further shortened. When the scanning mode i is selected in step S02, the main control unit 16 automatically sets the phase change amounts as a=a'+$\alpha_i$, b=b'+$\beta_i$, respectively. The correction coil is controlled by the phase change amounts set in step S03, and the ECP image is imaged (S04). Although the example of correcting the phase change amounts in the X direction and the Y direction according to the scanning mode has been described, since a period of the scanning coil signal 103 in the Y direction is extremely larger than the period of the scanning coil signal 102 in the X direction as shown in FIG. 1, an influence on the synchronization control is significantly small. Therefore, in step S03, the phase change amounts may be automatically set as a=a'+$\alpha_i$, b=b'. In this case, a $\beta$ column of the correction table 601 becomes unnecessary.

REFERENCE SIGN LIST 1 electron source
2 focusing lens
3 correction coil
4 scanning coil
5 electron beam
6 objective lens
7 sample
11 electron source control unit
12 focusing lens control unit
13 scanning coil control unit
14 objective lens control unit
15 correction coil control unit
16 main control unit

The invention claimed is:

1. An electron beam apparatus configured to perform angular scanning that changes an incident angle of an electron beam incident at a predetermined incident position on a sample, and having a plurality of scanning modes having different scanning speeds of the angular scanning, the electron beam apparatus comprising:
   a scanning coil configured to deflect the electron beam;
   an objective lens configured to swing back the electron beam deflected to the outside of an optical axis by the scanning coil;
   a correction coil disposed in a gap portion of a magnetic pole of the objective lens; and
   a main control unit configured to set predetermined phase change amounts with respect to control of the scanning coil in control of the correction coil, and the predetermined phase change amounts differ depending on the plurality of scanning modes.

2. The electron beam apparatus according to claim 1, wherein
   the correction coil is configured to correct spherical aberration generated in the objective lens.

3. The electron beam apparatus according to claim 1, wherein
   the plurality of scanning modes include a reference scanning mode, and
   the main control unit is configured to store phase correction amounts which are differences between phase change amounts in the plurality of scanning modes and phase change amounts in the reference scanning mode.

4. The electron beam apparatus according to claim 3, wherein
   the main control unit is configured to set phase change amounts in a first scanning mode, which is one of the plurality of scanning modes, by correcting the phase change amounts set in the reference scanning mode with the phase correction amounts in the first scanning mode.

5. The electron beam apparatus according to claim 4, wherein
   the phase change amounts in the reference scanning mode are set such that an axis of the objective lens is aligned with an axis of the correction coil in the reference scanning mode.

6. The electron beam apparatus according to claim 5, wherein
   a scanning speed in the reference scanning mode is faster than a scanning speed in the first scanning mode.

7. An electron beam apparatus configured to perform angular scanning that changes an incident angle of an electron beam incident at a predetermined incident position on a sample, and having a plurality of scanning modes having different scanning speeds of the angular scanning, the electron beam apparatus comprising:
   a scanning coil configured to deflect the electron beam;
   an objective lens configured to swing back the electron beam deflected to the outside of an optical axis by the scanning coil;
   a correction coil disposed in a gap portion of a magnetic pole of the objective lens; and
   a main control unit configured to set predetermined phase change amounts with respect to control of the scanning coil in control of the correction coil, and the predetermined phase change amounts differ depending on the plurality of scanning modes; and
   wherein
   the scanning coil includes a first scanning coil configured to deflect the electron beam in an X direction and a second scanning coil configured to deflect the electron beam in a Y direction, the first scanning coil is controlled by a first scanning coil signal $I_X$, and the second scanning coil is controlled by a second scanning coil signal $I_Y$,
   the correction coil is controlled by a correction coil signal $I_{cor}$, and
   the main control unit is configured to use, as a control amount of the correction coil signal $I_{cor}$, a function of a product of spherical aberration coefficient $C_s$ of the objective lens and $\{(I_X-a)^2+(I_Y-b)^2\}$, in which a and b represent the predetermined phase change amounts.

8. The electron beam apparatus according to claim 7, wherein
   the plurality of scanning modes include a reference scanning mode, and the main control unit is configured to use, as the control amount of the correction coil signal $I_{cor}$ in the first scanning mode, a function of a product of the spherical aberration coefficient $C_s$ of the objective lens and $[\{I_X-(a'+\alpha_i)\}^2+\{I_Y-(b'+\beta_i)\}^2]$, in which a' and b' represent phase change amounts in the reference scanning mode, and $\alpha_i$ and $\beta_i$ represent phase correction amounts which are differences between phase change amounts in a first scanning mode, which is one of the plurality of scanning modes, and phase change amounts in the reference scanning mode.

9. The electron beam apparatus according to claim 8, wherein the main control unit is configured to store the $\alpha_i$ and the $\beta_i$.

10. The electron beam apparatus according to claim 8, wherein in the reference scanning mode, the main control unit is configured to align an axis of the objective lens with an axis of the correction coil by controlling the control amount of the correction coil signal $I_{cor}$ with the function of a product of the spherical aberration coefficient $C_s$ of the objective lens and $\{(I_X-a')^2+(I_Y-b')^2\}$.

11. The electron beam apparatus according to claim 7, wherein the plurality of scanning modes include a reference scanning mode, and the main control unit is configured to use, as the control amount of the correction coil signal $I_{cor}$ in the first scanning mode, which is one of the plurality of scanning modes, a function of a product of the spherical aberration coefficient $C_s$ of the objective lens and $[\{I_X-(a'+\alpha_i)\}^2+(I_Y-b')^2]$ in which a' and b' represent phase change amounts in the reference scanning mode, and $\alpha_i$ and $\beta_i$ represent phase correction amounts which are differences between phase change amounts in a first scanning mode, which is one of the plurality of scanning modes, and phase change amounts in the reference scanning mode.

12. The electron beam apparatus according to claim 11, wherein the main control unit is configured to store the $\alpha_i$.

13. The electron beam apparatus according to claim 11, wherein in the reference scanning mode, the main control unit is configured to align an axis of the objective lens with an axis of the correction coil by controlling the control amount of the correction coil signal $I_{cor}$ with the function of a product of the spherical aberration coefficient $C_s$ of the objective lens and $\{(I_X-a')^2+(I_Y-b')^2\}$.

* * * * *